(12) United States Patent
Wang et al.

(10) Patent No.: US 8,501,636 B1
(45) Date of Patent: Aug. 6, 2013

(54) METHOD FOR FABRICATING SILICON DIOXIDE LAYER

(75) Inventors: Shao-Wei Wang, Taichung (TW); Yu-Ren Wang, Tainan (TW); Chien-Liang Lin, Taoyuan County (TW); Ying-Wei Yen, Miaoli County (TW); Kun-Yuan Lo, Tainan (TW); Chih-Wei Yang, Kaohsiung (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 13/556,247

(22) Filed: Jul. 24, 2012

(51) Int. Cl.
*H01L 21/31* (2006.01)
*H01L 21/469* (2006.01)

(52) U.S. Cl.
USPC ............ 438/787; 257/E21.079; 257/E21.082; 257/E21.282; 257/E21.283; 257/E21.284; 257/E21.301; 257/E21.559; 438/585; 438/591; 438/762; 438/765; 438/770; 438/906

(58) Field of Classification Search
USPC ................. 257/E21.079, E21.082, E21.282, 257/E21.283, E21.284, E21.301, E21.559; 438/585, 591, 762, 765, 770, 787, 906
See application file for complete search history.

(56) References Cited

U.S. PATENT DOCUMENTS

| | | | |
|---|---|---|---|
| 5,498,768 A | 3/1996 | Nishitani et al. | |
| 6,043,138 A | 3/2000 | Ibok | |
| 6,063,698 A | 5/2000 | Tseng | |
| 6,251,761 B1 | 6/2001 | Rodder | |
| 6,372,605 B1 | 4/2002 | Kuehne | |
| 6,380,104 B1 | 4/2002 | Yu | |
| 6,492,217 B1 | 12/2002 | Bai | |
| 6,509,232 B1 | 1/2003 | Kim | |
| 6,642,066 B1 | 11/2003 | Halliyal | |
| 6,656,852 B2 | 12/2003 | Rotondaro | |
| 6,670,275 B2 | 12/2003 | Lee | |
| 6,689,675 B1 | 2/2004 | Parker | |
| 6,696,345 B2 | 2/2004 | Chau | |
| 6,818,517 B1 | 11/2004 | Maes | |
| 6,818,553 B1 | 11/2004 | Yu | |
| 6,841,484 B2 | 1/2005 | Ying | |
| 6,855,607 B2 | 2/2005 | Achuthan | |
| 6,921,711 B2 | 7/2005 | Cabral, Jr. | |
| 7,012,027 B2 | 3/2006 | Perng | |
| 7,013,446 B2 | 3/2006 | Ohba | |
| 7,030,430 B2 | 4/2006 | Doczy | |
| 7,084,025 B2 | 8/2006 | Phua | |
| 7,112,495 B2 | 9/2006 | Ko | |
| 7,126,199 B2 | 10/2006 | Doczy | |
| 7,135,361 B2 | 11/2006 | Visokay | |
| 7,153,755 B2 | 12/2006 | Liu | |
| 7,157,378 B2 | 1/2007 | Brask | |
| 7,160,767 B2 | 1/2007 | Brask | |
| 7,208,366 B2 | 4/2007 | Tsai | |
| 7,250,658 B2 | 7/2007 | Doris | |
| 7,371,649 B2 | 5/2008 | Cheng | |
| 7,381,608 B2 | 6/2008 | Brask | |
| 7,384,880 B2 | 6/2008 | Brask | |

(Continued)

*Primary Examiner* — Asok K Sarkar
(74) *Attorney, Agent, or Firm* — WPAT, PC; Justin King

(57) ABSTRACT

A method for fabricating silicon dioxide layer is disclosed. The method includes the following steps. Firstly, a semiconductor substrate is provided. Next, the semiconductor substrate is cleaned with a solution containing hydrogen peroxide to form a chemical oxide layer on the semiconductor substrate. Then, the chemical oxide layer is heated in no oxygen atmosphere, such that the chemical oxide layer forms a compact layer. Then, the semiconductor substrate is heated in oxygen atmosphere to form a silicon dioxide layer between the semiconductor substrate and the compact layer.

16 Claims, 2 Drawing Sheets

U.S. PATENT DOCUMENTS

| | | |
|---|---|---|
| 7,402,480 B2 * | 7/2008 | Herbert et al. ............... 438/201 |
| 7,488,656 B2 | 2/2009 | Cartier |
| 7,501,336 B2 | 3/2009 | Doyle |
| 7,521,324 B2 | 4/2009 | Ohmi |
| 7,531,437 B2 | 5/2009 | Brask |
| 7,592,270 B2 | 9/2009 | Teo |
| 7,601,648 B2 | 10/2009 | Chua et al. |
| 7,824,990 B2 | 11/2010 | Chang |
| 2004/0007561 A1 | 1/2004 | Nallan |
| 2005/0202624 A1 | 9/2005 | Li |
| 2005/0275035 A1 | 12/2005 | Mathew |
| 2006/0054943 A1 | 3/2006 | Li |
| 2006/0094192 A1 | 5/2006 | Yang |
| 2006/0172548 A1 | 8/2006 | Wu |
| 2006/0211259 A1 | 9/2006 | Maes |
| 2006/0284271 A1 | 12/2006 | Doyle |
| 2007/0015365 A1 | 1/2007 | Chen |
| 2007/0072376 A1 | 3/2007 | Chen |
| 2007/0218661 A1 | 9/2007 | Shroff |
| 2008/0061366 A1 | 3/2008 | Liu |
| 2008/0070395 A1 | 3/2008 | Yen |
| 2008/0157231 A1 | 7/2008 | Wang |
| 2008/0217747 A1 * | 9/2008 | Chudzik et al. ............... 257/635 |
| 2009/0057759 A1 | 3/2009 | Obradovic |
| 2009/0057787 A1 | 3/2009 | Matsuki |
| 2009/0124097 A1 | 5/2009 | Cheng |
| 2009/0179283 A1 | 7/2009 | Adams |
| 2009/0200494 A1 | 8/2009 | Hatem |
| 2009/0289284 A1 | 11/2009 | Goh |
| 2010/0044783 A1 | 2/2010 | Chuang |
| 2010/0048027 A1 | 2/2010 | Cheng |
| 2010/0062592 A1 | 3/2010 | Clark |
| 2010/0068877 A1 | 3/2010 | Yeh |
| 2010/0075507 A1 | 3/2010 | Chang |
| 2010/0081262 A1 | 4/2010 | Lim |
| 2010/0129994 A1 | 5/2010 | Awad |
| 2010/0184281 A1 | 7/2010 | Hsu |
| 2010/0219481 A1 | 9/2010 | Tseng |
| 2012/0156891 A1 | 6/2012 | Lin et al. |
| 2012/0270410 A1 * | 10/2012 | Gourhant et al. ............... 438/763 |

* cited by examiner

METHOD FOR FABRICATING SILICON DIOXIDE LAYER

BACKGROUND OF THE INVENTION

1. Field of the Invention

The invention relates in general to a method for fabricating silicon dioxide layer, and more particularly to a method for fabricating compact silicon dioxide layer.

2. Description of the Related Art

In semiconductor, the silicone oxide layer is widely used as an insulation structure. For example, in a metal-oxide-semiconductor field-effect transistor (MOSFET), the gate and the substrate are separated by a gate dielectric layer.

However, if the structure of the gate dielectric layer is loose, it is easy for unwanted particles to diffuse into the semiconductor substrate, and then causes electric drift in for transistor.

SUMMARY OF THE INVENTION

The invention is directed to a method for fabricating silicon dioxide layer. The silicon dioxide layer prevents or blocks unwanted particles from entering the semiconductor substrate.

According to an embodiment of the present invention, a method for fabricating silicon dioxide layer is disclosed. The method includes the following steps. Firstly, a semiconductor substrate is provided. Next, the semiconductor substrate is cleaned with a solution containing hydrogen peroxide to form a chemical oxide layer on the semiconductor substrate. Then, the chemical oxide layer is heated in no oxygen atmosphere, such that the chemical oxide layer forms a compact layer. Then, the semiconductor substrate is heated in oxygen atmosphere to form a silicon dioxide layer between the semiconductor substrate and the compact layer.

According to another embodiment of the present invention, a method for fabricating silicon dioxide layer is disclosed. The method for fabricating silicon dioxide layer includes the following steps. A semiconductor substrate is provided. The semiconductor substrate is cleaned with an ozone water solution to form a chemical oxide layer on the semiconductor substrate. The chemical oxide layer is heated in no oxygen atmosphere, such that the chemical oxide layer forms a compact layer. The semiconductor substrate is heated in oxygen atmosphere to form a silicon dioxide layer between the semiconductor substrate and the compact layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Referring to FIGS. 1A~1D, processes of forming a silicon dioxide layer according to an embodiment of the invention are shown.

Figure 1A:
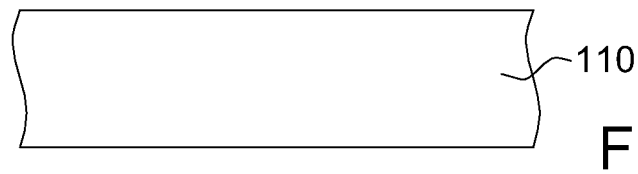
FIGS. 1A~1D illustrates processes of forming a silicon dioxide layer according to an embodiment of the invention.

As indicated in FIG. 1A, a semiconductor substrate 110 is provided, wherein the semiconductor substrate 110 is a silicone substrate, such as a P-type silicone substrate.

Figure 1B:
Figure 1C:
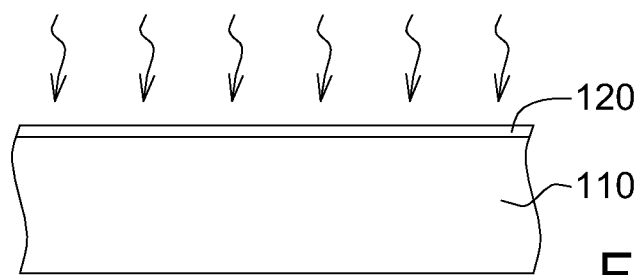

As indicated in FIG. 1B, the semiconductor substrate 110 is cleaned with an SC1 solution containing high-concentration hydrogen peroxide to form a chemical oxide layer 120' on the semiconductor substrate 110. The high-concentration hydrogen peroxide solution is such as the SC1 (standard clean 1) solution containing ammonia, hydrogen peroxide and de-ionized water for removing the residual particles deposited on the semiconductor substrate 110. The ratio of hydrogen peroxide, ammonia and de-ionized water in the SC1 solution of the present embodiment of the invention is 2~10:1:50.

In another embodiment, the semiconductor substrate 110 can be cleaned with an ozone water solution (O3/DIW) containing ozone and de-ionized water, wherein the concentration of ozone ranges between 60~110 ppm.

As indicated in FIG. 10, the chemical oxide layer 120' is heated, such that the chemical oxide layer 120' forms a compact layer 120. The present heating step can be completed in a no oxygen atmosphere, such as nitrogen atmosphere, the heating temperature ranges between 950~1050 degrees Celsius, and the heating time ranges between 30~60 seconds.

In the present heating step, the Dangling Bond are connected to bond more bonding between oxygen and silicone, such that the compact layer 120 is more compact. In terms of density, the compact layer 120 has larger density than the chemical oxide layer 120' (FIG. 1B). In terms of thickness, the thickness of the compact layer 120 is less than that of the chemical oxide layer 120'. For example, the thickness of the chemical oxide layer 120' is about 5 Å, and is reduced to 2~3 Å after the compact layer 120 is formed.

In the present embodiment of the invention, the semiconductor substrate 110 is cleaned with the SC1 solution containing high-concentration hydrogen peroxide or ozone water solution, so the number of oxygen atoms in the compact layer 120 is increased, and the oxygen to silicone ratio in the subsequently formed silicone oxide 130 (FIG. 1D) is close to the ideal ratio (that is, 2:1). The silicone oxide 130 with near ideal oxygen to silicone ratio forms resistance against nitrogen atoms in subsequent nitrogen treatment to avoid nitrogen atoms being diffused to the semiconductor substrate 110. Details of the oxygen to silicone ratio of the silicone oxide 130 are elaborated below.

Figure 1D:
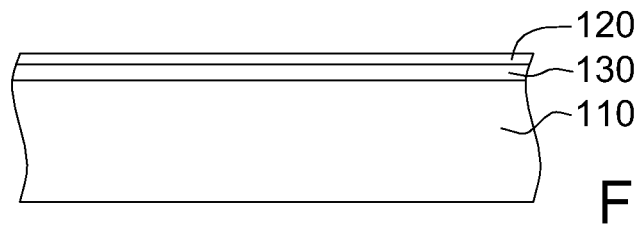

As indicated in FIG. 1D, the semiconductor substrate 110 is heated by such as the in-situ stream generator (ISSG) process or other oxidation process, such that a part of the semiconductor substrate 110 forms a silicone oxide 130 located between the semiconductor substrate 110 and the compact layer 120. The thickness of the silicone oxide 130 ranges between 7~8 Å. The present ISSG step is completed in an oxygen atmosphere and the heating temperature is about 900 degrees Celsius.

The oxygen to silicone ratio in the silicone oxide 130 may be determined according to the cleaning fluid used in the cleaning step. For example, when the semiconductor substrate is cleaned with an SC1 solution containing high-concentration hydrogen peroxide, the oxygen to silicone ratio in the silicone oxide 130 is about 0.96:1. When the semiconductor substrate 110 is cleaned with an ozone water solution, the oxygen to silicone ratio in the silicone oxide 130 is about 1.43:1. The closer to the ideal ratio the oxygen to silicone ratio is, the better quality the silicone oxide 130 will have, and the stronger associativity with the semiconductor substrate 110 the silicone oxide 130 will have.

The oxygen to silicone ratio in the silicone oxide 130 obtained according to the present embodiment of the invention is closer to the ideal ratio than that obtained by cleaning the semiconductor substrate 110 using a SC1 solution with lower concentration. The silicone oxide 130 of the present embodiment has stronger associativity with the semiconductor substrate 110 than the silicone oxide obtained by the conventional method has. The silicone oxide 130 of the present embodiment forms resistance against nitrogen atoms in subsequent nitrogen treatment to avoid the diffusion of nitrogen atoms. The diffusing depth of nitrogen atoms on the silicone oxide obtained by cleaning the semiconductor substrate 110 with SC1 solution with lower concentration reaches 35 Å. Relatively, the diffusing depth of nitrogen atoms on the silicone oxide 130 of the present embodiment of the invention reaches only 25 Å. The above experimental data show that the silicone oxide 130 of the present embodiment of the invention generates effective resistance against nitrogen to avoid nitrogen being diffused and entering the semiconductor substrate 110 in the nitrogen treatment.

The above method for fabricating silicon dioxide layer may be used in many semiconductor elements such as active elements. A number of methods for forming active elements according to the above method for fabricating silicon dioxide layer are exemplified below by using MOSFET.

Figure 2A:
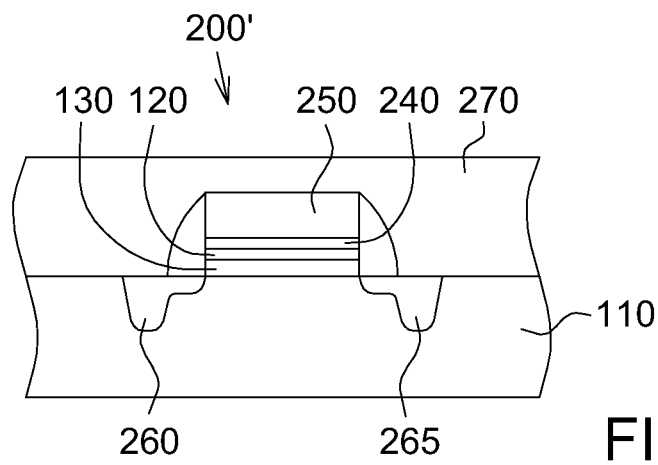
FIGS. 2A~2B illustrates processes of forming an active element according to an embodiment of the invention.
Figure 2B:
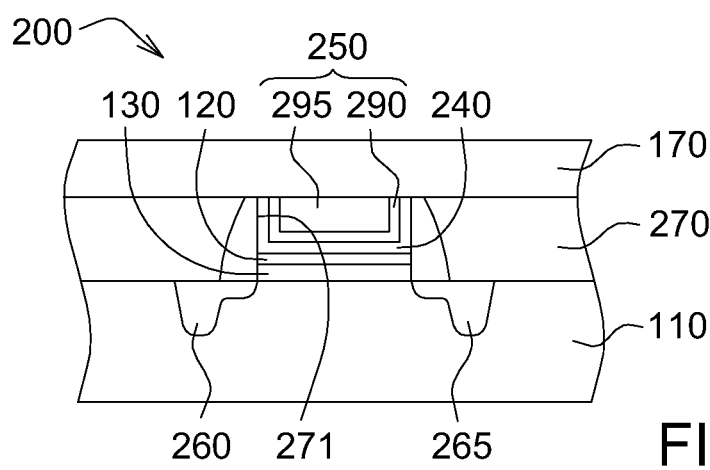

Referring to FIGS. 2A~2B, processes of forming an active element according to an embodiment of the invention are shown.

As indicated in FIG. 2A, a MOSFET 200' is formed. The MOSFET 200' comprises a compact layer 120, a silicone oxide 130, a gate dielectric layer 240, a gate 250, a first doped region 260 and a second doped region 265 are formed on the semiconductor substrate 110, wherein the gate dielectric layer 240 is formed between the semiconductor substrate 110 and the gate 250. The first doped region 260 and the second doped region 265 respectively are disposed in the semiconductor substrate 110 on two opposite lateral sides of the gate dielectric layer 240. The first doped region 260 and the second doped region 265, such as n-type lightly doped regions, may respectively be used as a drain and a source.

Due to the excellent combination between the silicone oxide 130 and the semiconductor substrate 110 in the present embodiment of the invention, the mobility rate for electrons in the channels of elements is increased. In comparison to the conventional silicone oxide with loose structure, the silicon dioxide layer 130 of the present embodiment of the invention with compact structure makes the mobility rate for electrons in the channels of elements increase by 14%.

Due to the excellent combination between the silicone oxide 130 and the semiconductor substrate 110 in the present embodiment of the invention, the firing currents of elements are increased. Let the same latching current (such as $10^{-8}$ A/µm) be used as a comparison reference. The experimental data shows that in comparison to the conventional silicone oxide with loose structure, the silicon dioxide layer 130 of the present embodiment of the invention with compact structure makes the firing currents of elements increase by about 5.3%.

As indicated in FIG. 2A, a dielectric layer 270 encapsulating MOSFET 200' is formed.

The foregoing gate dielectric layer 240 can be formed by a material with high dielectric constant, and the gate 250 can be a metal gate formed by a material with work function and a material with low resistance (or barrier layer). In manufacturing, it is achieved by "metal gate last and material with high dielectric constant last" process, or "metal gate last and material with high dielectric constant first" process. When "metal gate last and material with high dielectric constant last" process is adopted, the silicone oxide 130 and the compact layer 120 can be formed first or last.

The "silicon dioxide layer first, compact layer first, metal gate last and material with high dielectric constant last" process is disclosed below in detail. The dielectric layer 270 illustrated in FIG. 2A is grinded to expose the dummy gate 250.

Then, the dummy gate dielectric layer 240 and the dummy gate 250 are removed by such as the etching process to form an indentation 271.

As indicated in FIG. 2B, a gate dielectric with high dielectric constant 240 is formed on the compact layer 120 by such as the chemical vapor deposition (CVD) method or the physical vapor deposition (PVD) process, wherein the gate dielectric layer with high dielectric constant 240 complies with the silhouette of the top-surface of the compact layer 120 and the silhouette of the side-wall of the indentation 271. In addition, the gate dielectric layer 240 has high dielectric constant, and a thickness of the gate dielectric layer 240 is about 30 Å.

To increase element reliability, nitrogen treatment can be performed on the gate dielectric layer with high dielectric constant 240 after the gate dielectric layer with high dielectric constant 240 is formed.

In FIG. 2B, a conductive layer 290 is formed on the gate dielectric layer 240 by such as the deposition process, wherein the conductive layer 290 complies with the structure of the gate dielectric layer 240. The conductive layer 290 of the present embodiment of the invention, realized by a conductive layer with work function, is formed by such as titanium nitride (TiN) or aluminum titanium (TiAl).

In FIG. 2B, a conductive layer 295 is formed on the conductive layer 290 by such as the deposition process, wherein the conductive layer 295 fills up the indentation 271. The conductive layer 295 has low resistance, such as aluminum metal. The conductive layer 290 and 295 together constitute a gate 250 of MOSFET structure.

In FIG. 2B, a dielectric layer 170 covering the dielectric layer 270 is formed to form MOSFET 200

Despite the method for fabricating active element disclosed in the above embodiments is exemplified by "silicon dioxide layer first, high-K layer last and gate first" process, however, the above exemplification is not for limiting the scope of protection of the embodiments of the invention. Another "silicon dioxide layer first, high-K layer first and gate last" process is disclosed below.

Figure 2C:
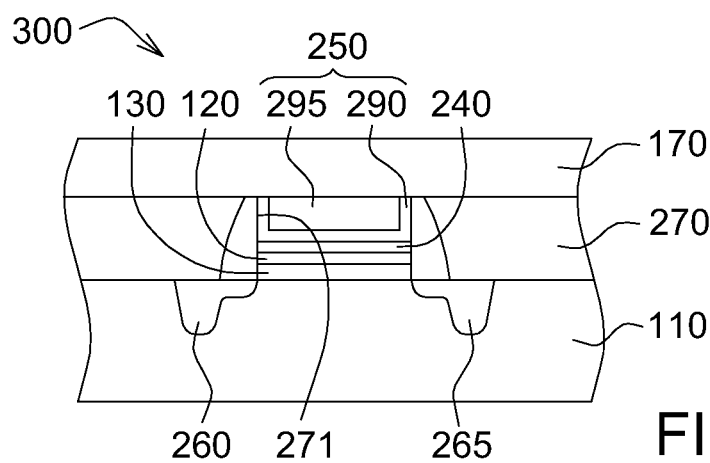
FIG. 2C illustrates processes of forming an active element according to another embodiment of the invention.

Referring to FIG. 2C, processes of forming another active element according to an embodiment of the invention are shown. In present embodiment, the gate 250 of FIG. 2A is etched, but the gate dielectric layer 240 is retained. Then, the conductive layer 290 is formed on gate dielectric layer 240 having high dielectric constant. Then, a conductive layer 295 is formed to fills up the indentation 271, wherein the conductive layer 290 and 295 together constitute a gate 250 of MOSFET structure. Then, a dielectric layer 170 covering the dielectric layer 270 is formed to form MOSFET 300 of FIG. 2C.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating silicon dioxide layer, comprising:

providing a semiconductor substrate;

cleaning the semiconductor substrate with a solution containing hydrogen peroxide to form a chemical oxide layer on the semiconductor substrate;

heating the chemical oxide layer in no oxygen atmosphere, such that the chemical oxide layer forms a compact layer; and heating the semiconductor substrate in oxygen atmosphere to form a silicon dioxide layer between the semiconductor substrate and the compact layer;

wherein the step of cleaning the semiconductor substrate, the step of heating the chemical oxide layer in no oxygen atmosphere, and the step of heating the semiconductor substrate in oxygen atmosphere are performed sequentially.

2. The method for fabricating silicon dioxide layer according to claim 1, wherein the step of heating the chemical oxide layer is completed in a nitrogen atmosphere.

3. The method for fabricating silicon dioxide layer according to claim 1, wherein in the step of heating the chemical oxide layer, the heating temperature ranges between 950~1000 degrees Celsius.

4. The method for fabricating silicon dioxide layer according to claim 1, wherein in the step of heating the chemical oxide layer, the heating time ranges between 30~60 seconds.

5. The method for fabricating silicon dioxide layer according to claim 1, wherein the solution is formed by hydrogen peroxide, ammonia and de-ionized water at a ratio of 2~10:1:50.

6. The method for fabricating silicon dioxide layer according to claim 1, wherein the thickness of the compact layer ranges between 2~3 Å.

7. The method for fabricating silicon dioxide layer according to claim 1, further comprising:

forming a high-K layer on the compact layer.

8. The method for fabricating silicon dioxide layer according to claim 1, wherein the density of the compact layer is larger density than that of the chemical oxide layer.

9. A method for fabricating silicon dioxide layer, comprising:

providing a semiconductor substrate;

cleaning the semiconductor substrate with an ozone water solution to form a chemical oxide layer on the semiconductor substrate;

heating the chemical oxide layer in no oxygen atmosphere, such that the chemical oxide layer forms a compact layer; and heating the semiconductor substrate in oxygen atmosphere to form a silicon dioxide layer between the semiconductor substrate and the compact layer;

wherein the step of cleaning the semiconductor substrate, the step of heating the chemical oxide layer in no oxygen atmosphere, and the step of heating the semiconductor substrate in oxygen atmosphere are performed sequentially.

10. The method for fabricating silicon dioxide layer according to claim 9, wherein the step of heating the chemical oxide layer is completed in a nitrogen atmosphere.

11. The method for fabricating silicon dioxide layer according to claim 9, wherein in the step of heating the chemical oxide layer, the heating temperature ranges between 950~1000 degrees Celsius.

12. The method for fabricating silicon dioxide layer according to claim 9, wherein in the step of heating the chemical oxide layer, the heating time ranges between 30~60 seconds.

13. The method for fabricating silicon dioxide layer according to claim 9, wherein in the ozone water solution, the concentration of ozone ranges between 60~110 ppm.

14. The method for fabricating silicon dioxide layer according to claim 9, wherein the thickness of the compact layer ranges between 2~3 Å.

15. The method for fabricating silicon dioxide layer according to claim 9, further comprising: forming a high-K layer on the compact layer.

16. The method for fabricating silicon dioxide layer according to claim 9, wherein the density of the compact layer is larger density than that of the chemical oxide layer.

* * * * *